(12) United States Patent
Qin

(10) Patent No.: US 11,398,504 B2
(45) Date of Patent: Jul. 26, 2022

(54) DISPLAY PANEL AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Fang Qin, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 559 days.

(21) Appl. No.: 16/343,689

(22) PCT Filed: Dec. 29, 2018

(86) PCT No.: PCT/CN2018/125489
§ 371 (c)(1),
(2) Date: Apr. 19, 2019

(87) PCT Pub. No.: WO2020/113736
PCT Pub. Date: Jun. 11, 2020

(65) Prior Publication Data
US 2021/0335840 A1    Oct. 28, 2021

(30) Foreign Application Priority Data
Dec. 4, 2018    (CN) .............................. 201811473558

(51) Int. Cl.
*H01L 27/12*    (2006.01)

(52) U.S. Cl.
CPC ...... *H01L 27/1244* (2013.01); *H01L 27/1259* (2013.01); *H01L 27/1218* (2013.01); *H01L 27/1248* (2013.01)

(58) Field of Classification Search
CPC ............. H01L 27/1244; H01L 27/1259; H01L 27/1218; H01L 27/1248
See application file for complete search history.

(56) References Cited

U.S. PATENT DOCUMENTS

| 2016/0014883 | A1* | 1/2016 | Cho | G06F 1/1652 361/749 |
| 2016/0079281 | A1 | 3/2016 | Park et al. | |
| 2016/0093685 | A1* | 3/2016 | Kwon | G06F 1/1652 257/40 |

(Continued)

FOREIGN PATENT DOCUMENTS

| CN | 105826350 A | 8/2016 |
| CN | 106887447 A | 6/2017 |

(Continued)

*Primary Examiner* — Sitaramarao S Yechuri
(74) *Attorney, Agent, or Firm* — Osha Bergman Watanabe & Burton LLP

(57) ABSTRACT

A flexible display panel and a method for manufacturing same are provided. The flexible display panel includes a bending region, and data signal lines are disposed within the bending region. At least one of the data signal lines includes at least one metal layer, at least one of the data signal lines includes at least one stress buffer region, and a stress relieving feature is disposed within the stress buffer region.

13 Claims, 9 Drawing Sheets

(56) References Cited

U.S. PATENT DOCUMENTS

| | | |
|---|---|---|
| 2016/0218305 A1 | 7/2016 | Kim et al. |
| 2017/0170206 A1* | 6/2017 | Lee .................. H01L 29/78633 |
| 2019/0013486 A1 | 1/2019 | Li et al. |
| 2019/0082528 A1* | 3/2019 | Zhang ................ H01L 27/3244 |
| 2019/0157312 A1 | 5/2019 | Lee et al. |

FOREIGN PATENT DOCUMENTS

| | | | |
|---|---|---|---|
| CN | 206332028 U | | 7/2017 |
| CN | 107204357 A | | 9/2017 |
| CN | 107742639 A | * | 2/2018 |
| CN | 108922911 A | | 11/2018 |
| CN | 109148534 A | * | 1/2019 |
| CN | 109461830 A | * | 3/2019 |
| CN | 112436041 A | * | 3/2021 |
| KR | 20100102106 A | * | 9/2010 ......... C23C 16/4581 |

\* cited by examiner

DISPLAY PANEL AND METHOD FOR MANUFACTURING SAME

FIELD OF INVENTION

The present invention relates to a technical field in displays, and particularly to a display panel and a method for manufacturing same.

BACKGROUND OF DISCLOSURE

With the development of display technology, users have higher and higher requirements for appearance designs of display panels, such as designs of narrow bezels.

A bottom bezel of a display panel in an existing mobile phone generally adopts a chip on a flexible printed circuit (chip on FPC, chip on film, or COF) or a chip on a polyimide (chip on Pi, or COP) process to set a position of a driving chip, so that the width of the bottom bezel in the display panel is narrowed, but the process is difficult and the cost is high. A bending region of the display panel includes metal wires for signal transmission, and when the curvature of the panel reaches a certain value, the metal wires are easily cracked or even broken, resulting in failure of signal transmission of the display panel.

Therefore, there is a need for a flexible display panel to solve the above problem.

SUMMARY OF INVENTION

The present disclosure provides a flexible display panel and a method for manufacturing to solve a technical problem that data signal lines of a bending region of an existing display panel is easily broken.

In order to solve the above problem, the technical solution provided by the present disclosure is as follows:

The present disclosure provides a flexible display panel and includes:

a display region, and a non-display region located at a periphery of the display region, wherein the non-display region includes a bending region, data signal lines are disposed within the bending region, and at least one of the data signal lines includes at least one metal layer;

wherein at least one of the data signal lines includes at least one stress buffer region, and a stress relieving feature is disposed within the stress buffer region.

In the flexible display panel of the present disclosure, the stress relieving feature is grooves.

In the flexible display panel of the present disclosure, the bending region includes a first bending segment, a second bending segment, and a third bending segment, the first bending segment is adjacent to the display region, the third bending segment is away from the display region, the second bending segment is located between the first bending segment and the third bending segment; and a distribution density of the grooves varies over the first bending segment, the second bending segment, and the third bending segment.

In the flexible display panel of the present disclosure, a radius of curvature of the second bending segment is not greater than a radius of curvature of the first bending segment, and the radius of curvature of the second bending segment is not greater than a radius of curvature of the third bending segment.

In the flexible display panel of the present disclosure, the distribution density of the grooves within the second bending segment is not less than the distribution density of the grooves within the first bending segment, and the distribution density of the grooves within the second bending segment is not less than the distribution density of the grooves within the third bending segment.

In the flexible display panel of the present disclosure, a thickness of the metal layer of the second bending segment is not greater than a thickness of the metal layer of the first bending segment, and the thickness of the metal layer of the second bending segment is not greater than a thickness of the metal layer of the third bending segment.

In the flexible display panel of the present disclosure, a thickness of the metal layer of the data signal lines gradually decreases along a direction from the first bending segment to the second bending segment; and the thickness of the metal layer of the data signal lines gradually increases along a direction from the second bending segment to the third bending segment.

In the flexible display panel of the present disclosure, a depth of the grooves gradually increases along a direction from the first bending segment to the second bending segment; and the depth of the grooves gradually decreases along a direction from the second bending segment to the third bending segment.

In the flexible display panel of the present disclosure, a radius of curvature of the second bending segment is greater than a radius of curvature of the first bending segment, and a radius of curvature of the second bending segment is greater than a radius of curvature of the third bending segment.

In the flexible display panel of the present disclosure, the distribution density of the grooves within the second bending segment is less than the distribution density of the grooves within the first bending segment, and the distribution density of the grooves within the second bending segment is less than the distribution density of the grooves within the third bending segment.

In the flexible display panel of the present disclosure, a thickness of the metal layer of the second bending segment is greater than a thickness of the metal layer of the first bending segment, and the thickness of the metal layer of the second bending segment is greater than a thickness of the metal layer of the third bending segment.

In the flexible display panel of the present disclosure, a thickness of the metal layer of the data signal lines gradually increases along a direction from the first bending segment to the second bending segment; and the thickness of the metal layer of the data signal lines gradually decreases along a direction from the second bending segment to the third bending segment.

In the flexible display panel of the present disclosure, a depth of the grooves gradually decreases along a direction from the first bending segment to the second bending segment; and the depth of the grooves gradually increases along a direction from the second bending segment to the third bending segment.

In the flexible display panel of the present disclosure, the data signal lines include at least a first metal layer, a second metal layer and a third metal layer; and the stress buffer region includes at least the first metal layer and the third metal layer.

In the flexible display panel of the present disclosure, in a condition that the stress buffer region only includes the first metal layer and the third metal layer, a maximum depth of the grooves is not less than a sum of a thickness of the second metal layer and a thickness of the third metal layer.

In the flexible display panel of the present disclosure, in a condition that the stress buffer region includes the first metal layer, the second metal layer and the third metal layer, a maximum depth of the grooves is less than a sum of a thickness of the second metal layer and a thickness of the third metal layer.

The present disclosure also provides a method for manufacturing a flexible display panel including a display region and a non-display region located at a periphery of the display region, the non-display region including a bending region, wherein the method for manufacturing the flexible display panel comprises following steps of:

providing a substrate;

forming a thin film transistor layer and an organic filling layer on the substrate; and forming at least one data signal line on the thin film transistor layer and the organic filling layer, wherein the at least one data signal line includes at least one metal layer, the at least one data signal line includes at least one stress buffer region, and a stress relieving feature is disposed within the stress buffer region.

In the manufacturing method of the present disclosure, the step of forming the at least one data signal line on the organic filling layer comprises following steps of:

forming a first metal layer and a second metal layer sequentially on the organic filling layer;

performing an etching process on the second metal layer corresponding to the stress buffer region, or on both the first metal layer and the second metal layer corresponding to the stress buffer region, to form the stress relieving feature in the stress buffer region; and forming a third metal layer on the second metal layer.

In the manufacturing method of the present disclosure, the step of forming the at least one data signal line on the organic filling layer comprises following steps of:

forming a first metal layer, a second metal layer, and a third metal layer on the organic filling layer;

performing an etching process on the third metal layer corresponding to the stress buffer region, on both the second metal layer and the third metal layer corresponding to the stress buffer region, or on all of the first metal layer, the second metal layer and the third metal corresponding to the stress buffer region, to form the stress relieving feature in the stress buffer region; and forming a fourth metal layer on the third metal layer.

In the manufacturing method of the present disclosure, the stress relieving feature is grooves, the bending region includes a first bending segment, a second bending segment, and a third bending segment, the first bending segment is adjacent to the display region, the third bending segment is away from the display region, the second bending segment is located between the first bending segment and the third bending segment, and a distribution density of the grooves varies over the first bending segment, the second bending segment, and the third bending segment.

Beneficial Effects: In the present disclosure, by disposing the stress relieving feature on the data signal lines in the bending region, not only is the bending stress of the data signal lines reduced upon being bent, but also the impedance of the data signal lines is decreased, thereby effectively improving the technical problem of the broken signal lines after being bent and the failed signal transmission, and prolonging the service life of the flexible display panel.

BRIEF DESCRIPTION OF DRAWINGS

In order to more clearly illustrate the embodiments of the present invention or the technical solutions in prior arts, the following briefly introduces the accompanying drawings used in the embodiments. Obviously, the drawings in the following description merely show some of the embodiments of the present invention. As regards one of ordinary skill in the art, other drawings can be obtained in accordance with these accompanying drawings without making creative efforts.

DETAILED DESCRIPTION OF PREFERRED EMBODIMENTS

Figure 1:
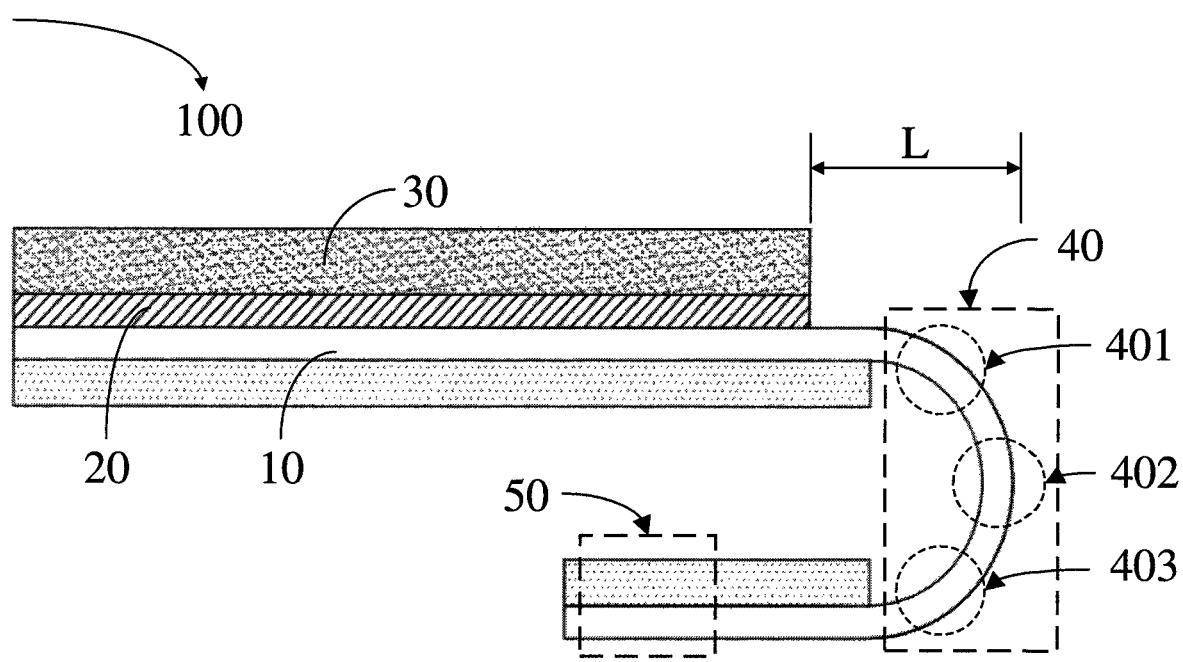
FIG. 1 is a structural diagram of a flexible display panel of the present disclosure.

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, units with similar structures are indicated by the same reference number.

Refer to FIG. 1, which is a structural diagram of a flexible display panel of the present disclosure.

Figure 2:
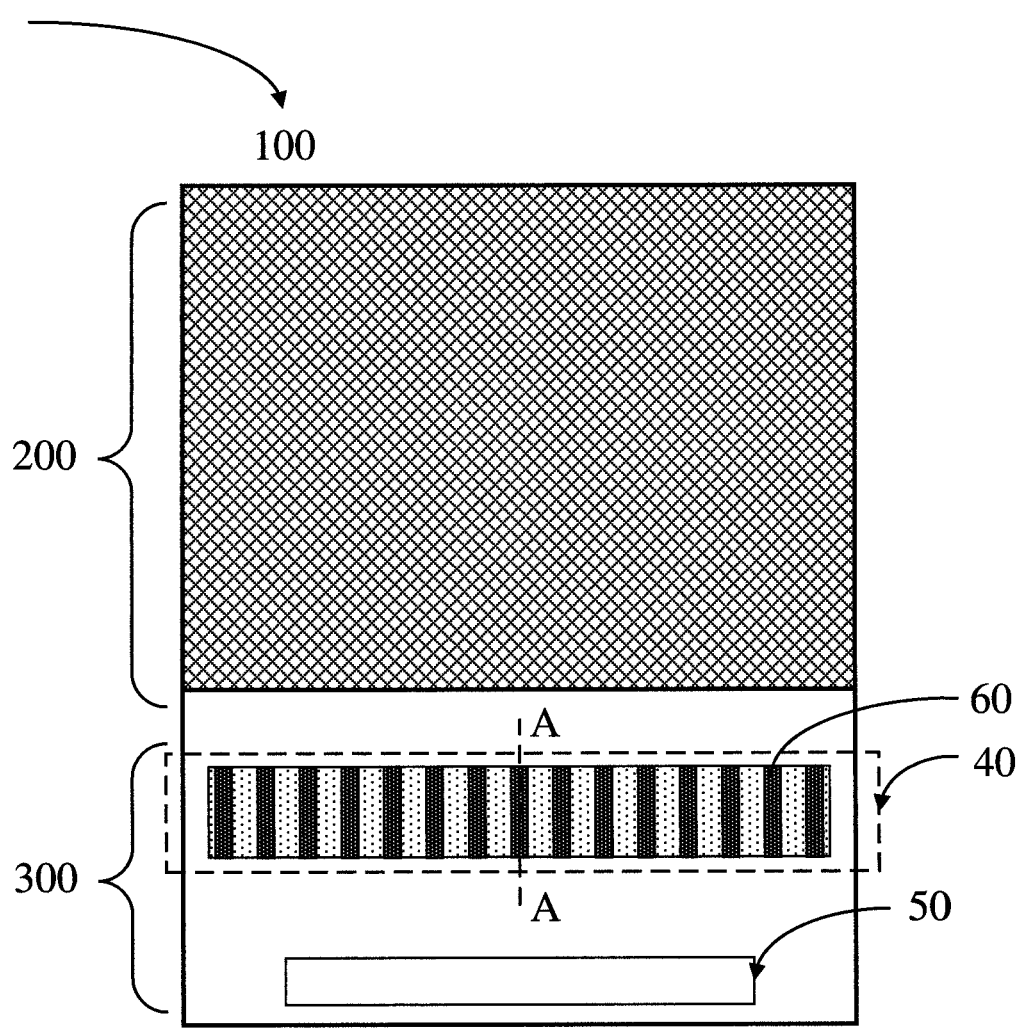
FIG. 2 is an unbent plane view of a bending region of the flexible display panel of the present disclosure.

Refer to FIG. 2, which is an unbent plane view of a bending region of a flexible display panel of the present disclosure.

The flexible display panel 100 includes a substrate 10, and includes a light emitting element layer 20 and an encapsulation layer 30 located on the substrate 10.

In an embodiment, the substrate 10 is a flexible substrate, and material of the flexible substrate may be polyimide (PI).

The flexible display panel 100 includes a display region 200 and a non-display region 300 located at a periphery of the display region 200. The non-display region 300 includes a bending region 40 adjacent to the display region 200 and a binding region 50 away from the display region 200, and the bending region 40 is located between the display region 200 and the binding region 50.

A plurality of data signal lines 60 are disposed within the bending region 40, and the data signal lines 60 extend from the display region 200 through the bending region to the binding region 50.

In the flexible display panel 100, driving chips and part of signal lines are moved to a back surface of the display region 200 by bending the bending region 40, thereby narrowing a width of a bottom bezel of the flexible display panel 100, such as distance L in FIG. 1.

Figure 3:
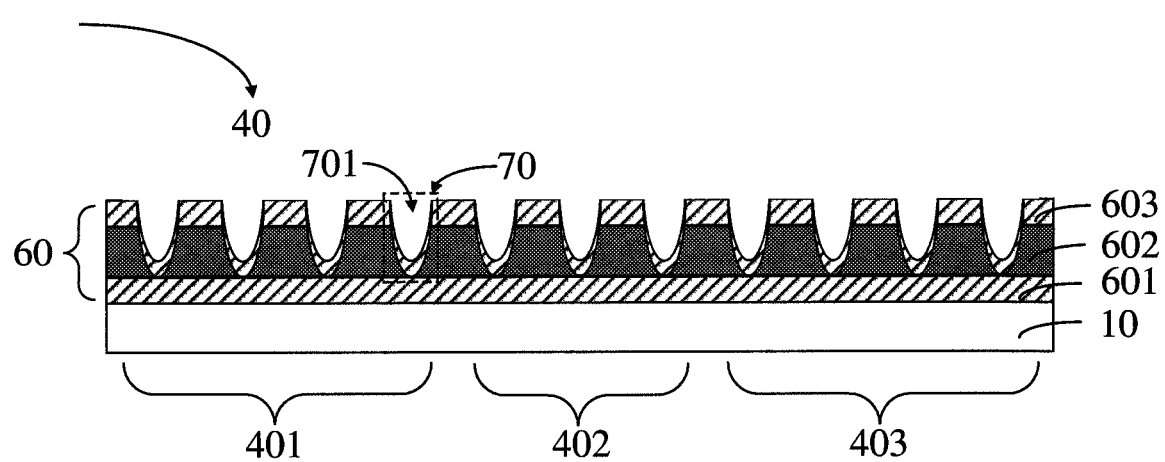
FIG. 3 is a first cross-sectional view of a flexible display panel of a first embodiment of the present disclosure taken along a section A-A in FIG. 2.

Refer to FIG. 3, which is a first cross-sectional view of a flexible display panel of a first embodiment of the present disclosure taken along a section A-A in FIG. 2.

At least one of the data signal lines 60 includes at least one metal layer. At least one of the data signal lines 60 includes at least one stress buffer region 70.

In an embodiment, a stress relieving feature 701 is disposed within the stress buffer region 70.

In an embodiment, the stress relieving feature 701 may be grooves.

In an embodiment, the data signal line 60 includes at least a first metal layer 601, a second metal layer 602, and a third metal layer 603.

In an embodiment, the first metal layer 601 may be titanium, the second metal layer 602 may be aluminum, and the third metal layer 603 may be titanium.

In an embodiment, the thickness of the first metal layer 601 is the same as the thickness of the third metal layer, and the thickness of the second metal layer 602 is greater than the thickness of the first metal layer 601 or the thickness of the third metal layer 603.

In an embodiment, the stress buffer region 70 includes at least the first metal layer 601 and the third metal layer 603.

Refer to FIG. 3. The stress buffer region 70 includes the first metal layer 601 and the third metal layer 603, and the maximum depth of the grooves is not less than the sum of the thickness of the second metal layer 602 and the thickness of the third metal layer 603.

Figure 4:
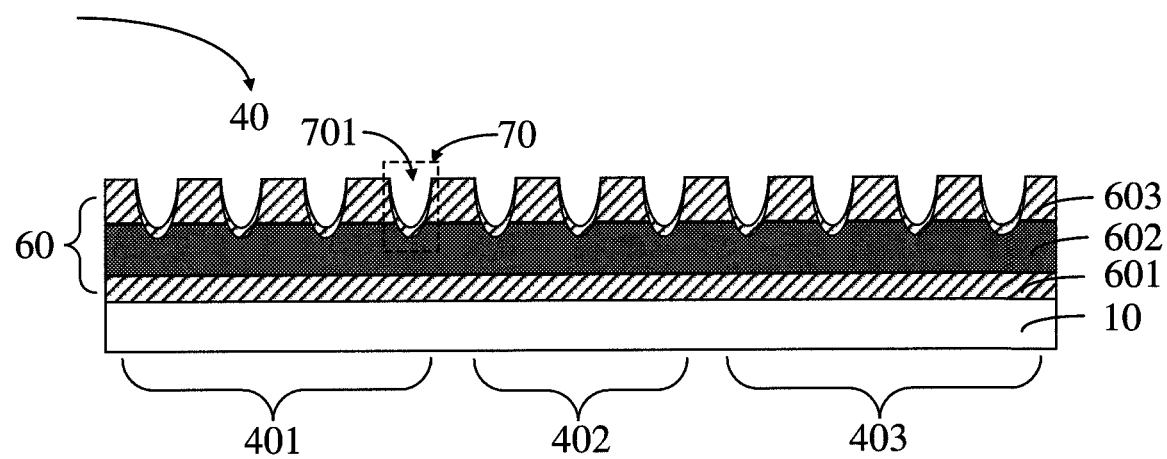
FIG. 4 is a second cross-sectional view of the flexible display panel of the first embodiment of the present disclosure taken along the section A-A in FIG. 2.

Refer to FIG. 4, which is a second cross-sectional view of the flexible display panel of FIG. 2 along section A-A.

In a condition that the stress buffer region 70 includes the first metal layer 601, the second metal layer 602, and the third metal layer 603, the maximum depth of the grooves is less than the sum of the thickness of the second metal layer 602 and the thickness of the third metal layer 603.

In an embodiment, the depth of the grooves of the stress buffer layers 70 can be adjusted according to actual conditions, and is not limited to the solutions of FIG. 3 and FIG. 4 in this embodiment.

Refer to FIG. 1 and FIG. 2. The bending region 40 includes a first bending segment 401, a second bending segment 402, and a third bending segment 403. The first bending segment 401 is adjacent to the display region 200, the third bending segment 403 is away from the display region 200, and the second bending segment 402 is located between the first bending segment 401 and the third bending segment 403.

In an embodiment, the distribution density of the grooves varies over the first bending segment 401, the second bending segment 402, and the third bending segment 403.

Refer to FIG. 1. A radius of curvature of the second bending segment 402 is not greater than a radius of curvature of the first bending segment 401, and the radius of curvature of the second bending segment 402 is not greater than a radius of curvature of the third bending segment 403.

In an embodiment, the radius of curvature of the second bending segment 402 is less than the radius of curvature of the first bending segment 401, and the radius of curvature of the second bending segment 402 is less than the radius of curvature of the third bending segment 403.

It can be seen from a mechanical analysis that bending stress applied to the second bending segment 402 is the greatest, and the second bending segment 402 is the most easily broken region of the flexible substrate. Bending stress of the second bending segment 402 is greater than bending stress of the first bending segment 401, and bending stress of the second bending segment 402 is greater than bending stress of the third bending segment 403.

Figure 5:
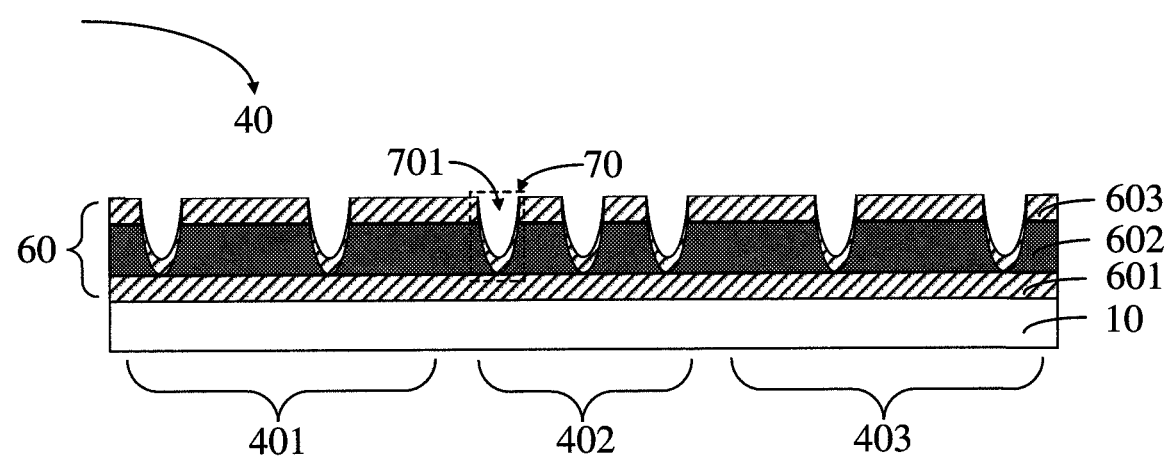
FIG. 5 is a third cross-sectional view of the flexible display panel of the first embodiment of the present disclosure taken along the section A-A in FIG. 2.

Refer to FIG. 5, which is a third cross-sectional view of the flexible display panel of the first embodiment of the present disclosure taken along the section A-A in FIG. 2.

The distribution density of the grooves within the second bending segment 402 is greater than the distribution density of the grooves within the first bending segment 401, and the distribution density of the grooves within the second bending segment 402 is greater than the distribution density of the grooves within the third bending segment 403.

In an embodiment, the distribution density of the grooves gradually increases along a direction from the first bending segment 401 to the second bending segment 402. The distribution density of the grooves gradually decreases along a direction from the second bending segment 402 to the third bending segment 403.

A region with high bending stress corresponds to the grooves with the high distribution density, and a region with low bending stress corresponds to the grooves with the low distribution density, thereby reducing the bending stress for each region and improving the bending performance of the flexible substrate.

Figure 6:
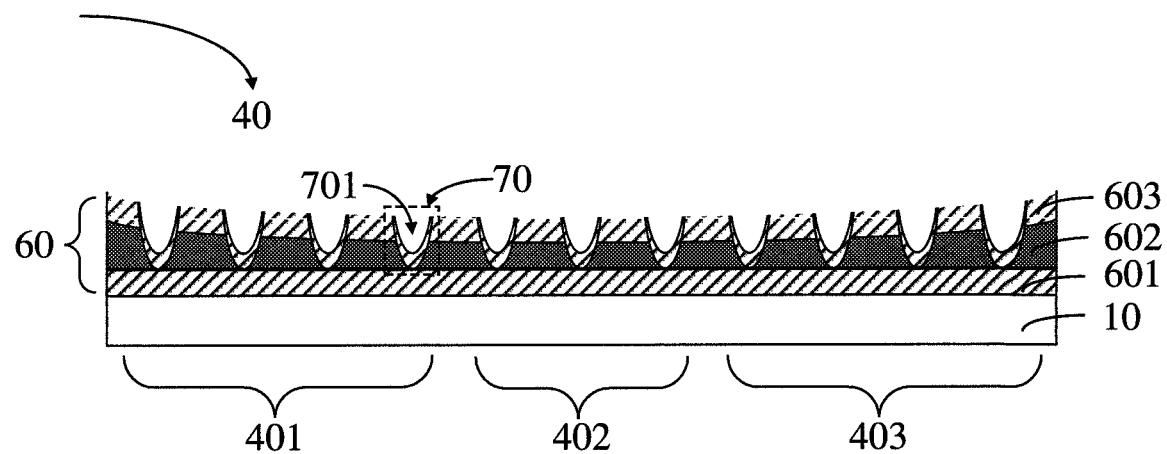
FIG. 6 is a fourth cross-sectional view of the flexible display panel of the first embodiment of the present disclosure taken along the section A-A in FIG. 2.

Refer to FIG. 6, which is a fourth cross-sectional view of the flexible display panel of the first embodiment of the present disclosure taken along the section A-A in FIG. 2.

The thickness of the metal layer of the second bending segment 402 is not greater than the thickness of the metal layer of the first bending segment 401, and the thickness of the metal layer of the second bending segment 402 is not greater than the thickness of the metal layer of the third bending segment 403.

In an embodiment, the thickness of the metal layer of the data signal lines 60 gradually decreases along the direction from the first bending segment 401 to the second bending segment 402. The thickness of the metal layer of the data signal lines 60 gradually increases along the direction from the second bending segment 402 to the third bending segment 403.

The region with high bending stress corresponds to the metal layer with the small thickness, and the region with low bending stress corresponds to the metal layer with the great thickness, to ensure a neutral axis of the bending region 40 to be a smooth transition arc, thereby avoiding concentrating stress on a partial region, and improving the bending performance of the flexible substrate.

Figure 7:
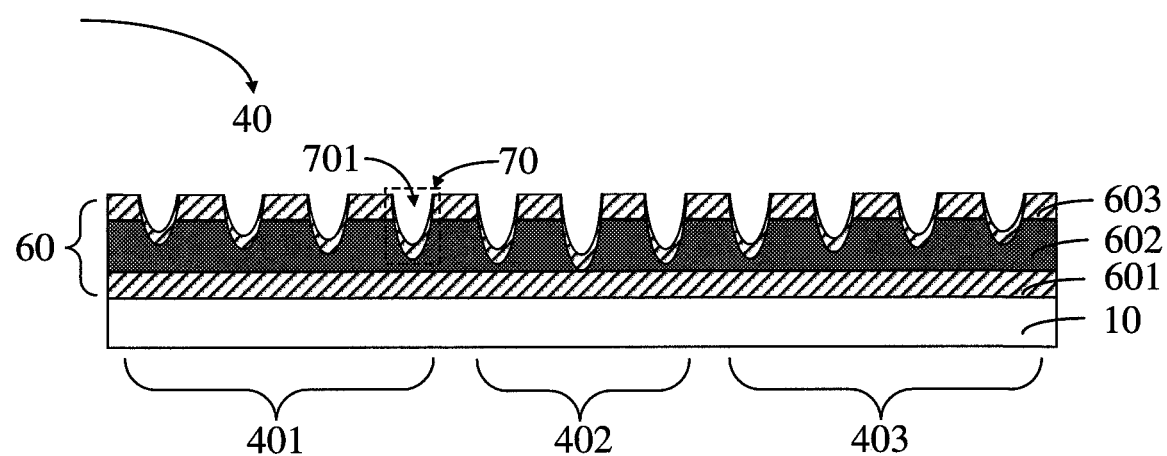
FIG. 7 is a fifth cross-sectional view of the flexible display panel of the first embodiment of the present disclosure taken along the section A-A in FIG. 2.

Refer to FIG. 7, which is a fifth cross-sectional view of the flexible display panel of the first embodiment of the present disclosure taken along the section A-A in FIG. 2.

The depth of the grooves gradually increases along the direction from the first bending segment 401 to the second bending segment 402, and the depth of the grooves gradually decreases along the direction from the second bending segment 402 to the third bending segment 403.

The region with high bending stress corresponds to the grooves with the great depth, and the region with low bending stress corresponds to the grooves with the shallow depth, thereby reducing the bending stress for each region, ensuring the neutral axis of the bending region 40 to be a smooth transition arc, avoiding concentrating stress on a partial region, and improving the bending performance of the flexible substrate.

In order to obtain a narrower bezel, the bending region 40 is bent into a circular arc, and the curvatures at both ends are smaller than the arc in the middle of the bending region 40.

Refer to FIG. 1. In an embodiment, the radius of curvature of the second bending segment 402 is greater than the radius of curvature of the first bending segment 401, and the radius of curvature of the second bending segment 402 is greater than the radius of curvature of the third bending segment 403.

It can be seen from the mechanical analysis that bending stress applied to the first bending segment 401 and the third segment 403 are the greatest, and the first bending segment 401 and the third segment 403 are the most easily broken regions of the flexible substrate. Bending stress of the second bending segment 402 is less than bending stress of the first bending segment 401, and bending stress of the second bending segment 402 is less than bending stress of the third bending segment 403.

Figure 8:
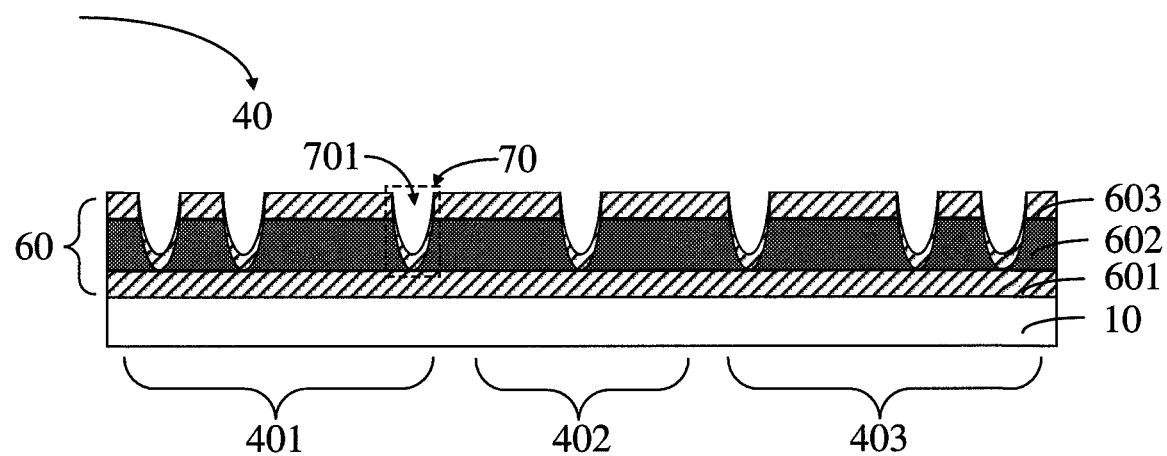
FIG. 8 is a first cross-sectional view of a flexible display panel of a second embodiment of the present disclosure taken along a section A-A in FIG. 2.

Refer to FIG. 8, which is a first cross-sectional view of a flexible display panel of a second embodiment of the present disclosure taken along the section A-A in FIG. 2.

The distribution density of the grooves within the second bending segment 402 is less than the distribution density of the grooves within the first bending segment 401, and the distribution density of the grooves within the second bending segment 402 is less than the distribution density of the grooves within the third bending segment 403.

In an embodiment, the distribution density of the grooves gradually decreases along the direction from the first bending segment 401 to the second bending segment 402. The distribution density of the grooves gradually increases along the direction from the second bending segment 402 to the third bending segment 403.

That is, the region with high bending stress corresponds to the grooves with the high distribution density, and the region with low bending stress corresponds to the grooves with the low distribution density, thereby reducing the bending stress for each region, avoiding stress concentration, and improving the bending performance of the flexible substrate.

Figure 9:
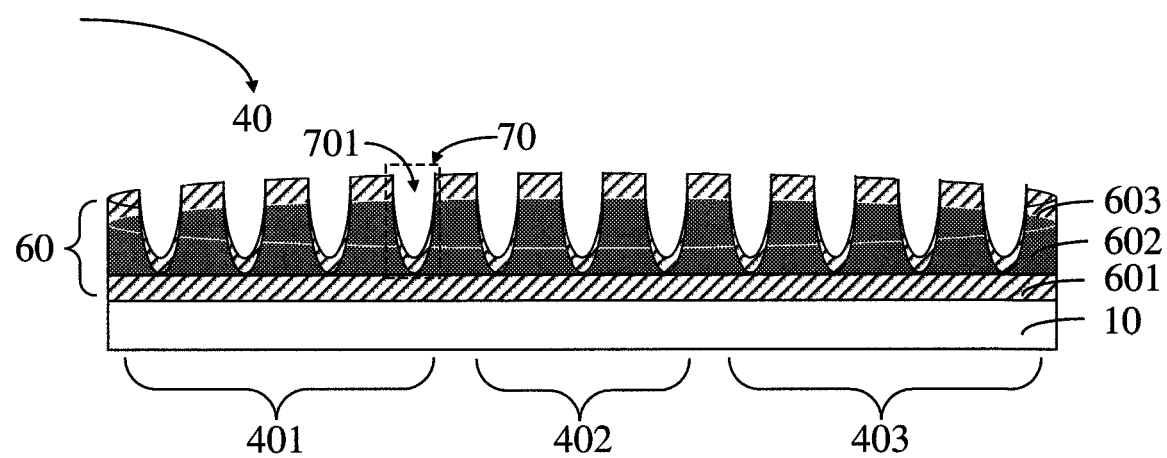
FIG. 9 is a second cross-sectional view of the flexible display panel of the second embodiment of the present disclosure taken along the section A-A in FIG. 2.

Refer to FIG. 9, which is a second cross-sectional view of the flexible display panel of the second embodiment of the present disclosure taken along the section A-A in FIG. 2.

The thickness of the metal layer of the second bending segment 402 is greater than the thickness of the metal layer of the first bending segment 401, and the thickness of the metal layer of the second bending segment 402 is greater than the thickness of the metal layer of the third bending segment 403.

In an embodiment, the thickness of the metal layer of the data signal lines gradually increases along the direction from the first bending segment 401 to the second bending segment 402 and the thickness of the metal layer of the data signal lines gradually decreases along the direction from the second bending segment 402 to the third bending segment 403.

The region with high bending stress corresponds to the metal layer with the small thickness, and the region with low bending stress corresponds to the metal layer with the great thickness, to ensure the neutral axis of the bending region 40 to be a smooth transition arc, thereby avoiding concentrating stress on a partial region, and improving the bending performance of the flexible substrate.

Figure 10:
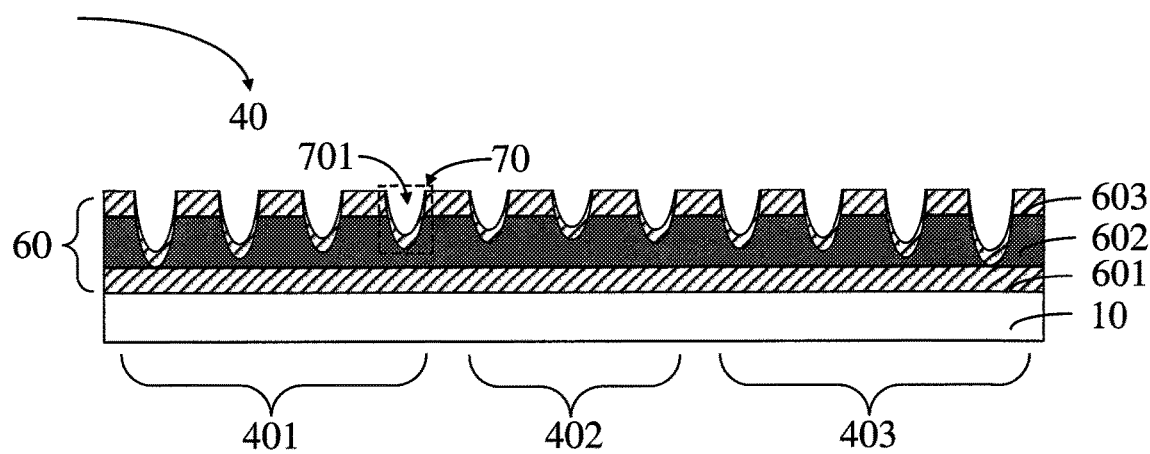
FIG. 10 is a third cross-sectional view of the flexible display panel of the second embodiment of the present disclosure taken along the section A-A in FIG. 2.

Refer to FIG. 10, which is a third cross-sectional view of the flexible display panel of the second embodiment of the present disclosure taken along the section A-A in FIG. 2.

The depth of the grooves gradually decreases along the direction from the first bending segment 401 to the second bending segment 402, and the depth of the grooves gradually increases along the direction from the second bending segment 402 to the third bending segment 403.

The region with high bending stress corresponds to the grooves with the great depth, and the region with low bending stress corresponds to the grooves the shallow depth, thereby reducing the bending stress for each region, avoiding concentrating stress on a partial region, and improving bending the performance of the flexible substrate.

In an embodiment, the data signal lines 60 adjacent to the first bending segment 401 and the third bending segment 403 are provided with the stress relieving feature 701. Disposing the stress relieving feature 701 on the data signal lines 60 where deformation has not occurred, preferably improves the bending resistance of the flexible substrate.

In an embodiment, the shapes of the grooves are not specifically limited.

Figure 11:
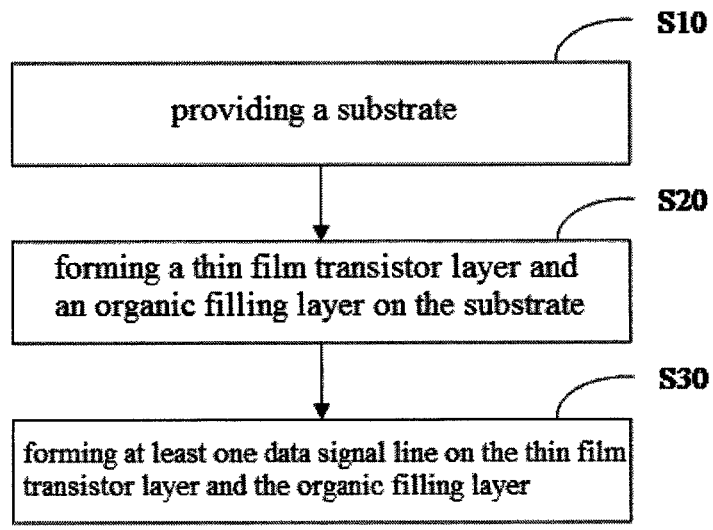
FIG. 11 is a step flowchart of a method for manufacturing a flexible display panel of the present disclosure.

Refer to FIG. 11, which is a step flowchart of a method for manufacturing a flexible display panel of the present disclosure.

The flexible display panel 100 includes a display region 200 and a non-display region 300 located at a periphery of the display region 200. The non-display region 300 includes a bending region 40 adjacent to the display region 200 and a binding region 50 is away from the display region 200, and the bending region 40 is located between the display region 200 and the binding region 50.

The method for manufacturing a flexible display panel includes the following steps:

S10: providing a substrate.

In an embodiment, the substrate is a flexible substrate, and material of the flexible substrate may be polyimide (PI).

S20: forming a thin film transistor layer and an organic filling layer on the substrate.

This step mainly forms the thin film transistor layer (not shown) and the organic filling layer on the substrate 10. After the thin film transistor layer is formed, holes are dug in a bending region, the organic layer is filled with an organic material to form the organic filling layer.

In an embodiment, material of the organic filling layer may be the same as the flexible substrate.

In an embodiment, material of the organic filling layer may be polyimide (PI).

S30: forming at least one data signal line on the thin film transistor layer and the organic filling layer.

Refer to FIG. 12A to FIG. 12D, which are diagrams showing a first manufacturing process of a bending region of a flexible display panel of the present disclosure.

In an embodiment, the at least one data signal line 60 includes at least one metal layer. The at least one data signal line 60 includes at least one stress buffer layer 70, a stress relieving feature 701 is disposed within the stress buffer region 70.

In an embodiment, the stress relieving feature 701 is grooves.

Step S30 includes the following steps:

S3011: sequentially forming a first metal layer 601 and a second metal layer 602 on the organic filling layer.

Figure 12A:
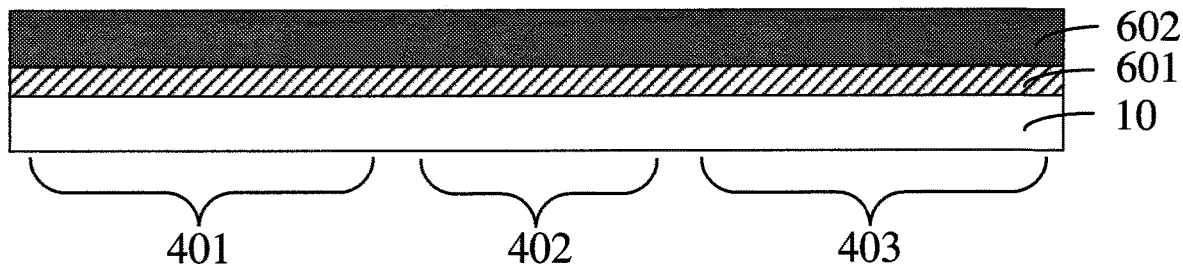
FIG. 12A to FIG. 12D are diagrams showing a first manufacturing process of a bending region of a flexible display panel of the present disclosure.

Refer to FIG. 12A. The first metal layer 601 may be titanium, and the second metal layer 602 may be aluminum.

S3012: etching the second metal layer 602 corresponding to the stress buffer region 70 or etching the first metal layer 601 and the second metal layer 602 corresponding to the stress buffer region 70, to form the stress relieving feature 701 in the stress buffer region 70.

Figure 12B:
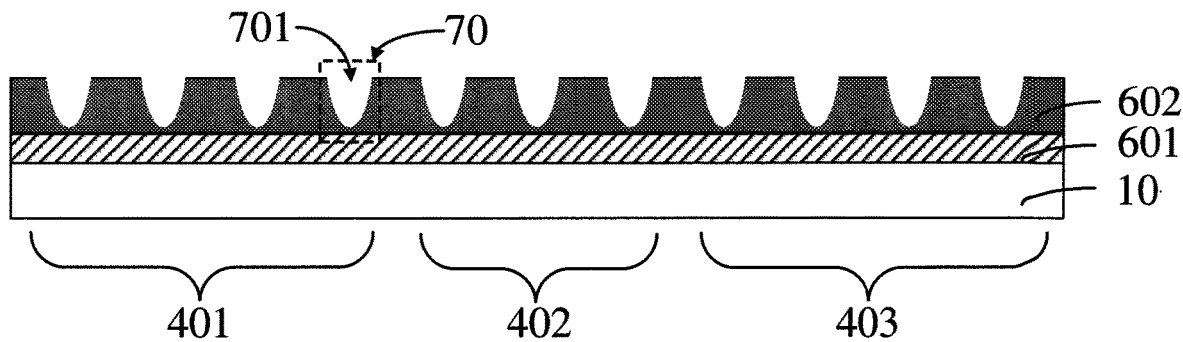

Refer to FIG. 12B. The second metal layer 602 corresponding to the stress buffer region 70 is etched, and the etching depth does not exceed the thickness of the second metal layer 602.

Figure 12C:
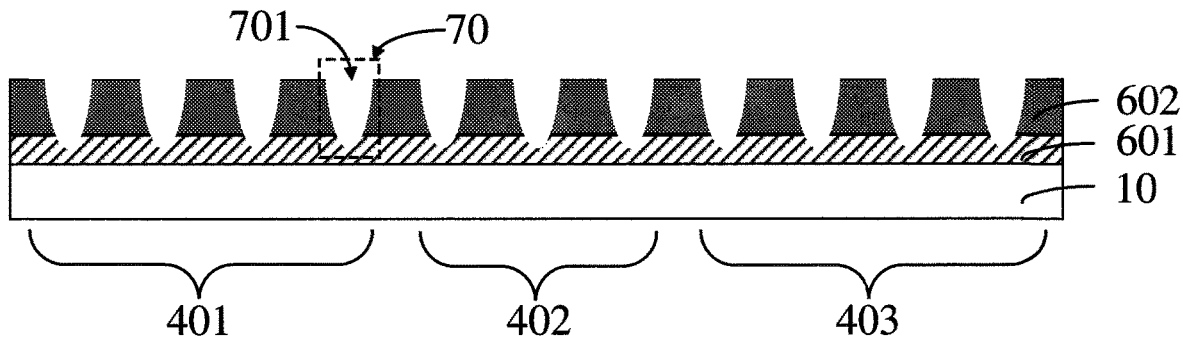

Refer to FIG. 12C. The second metal layer 602 and the first metal layer 601 corresponding to the stress buffer region 70 are etched, and the etching depth does not exceed the thickness of the first metal layer 601 in combination with the second metal layer 602.

In an embodiment, the etching process may be one of dry etching and wet etching.

S3013: forming a third metal layer 603 on the second metal layer 602.

Figure 12D:
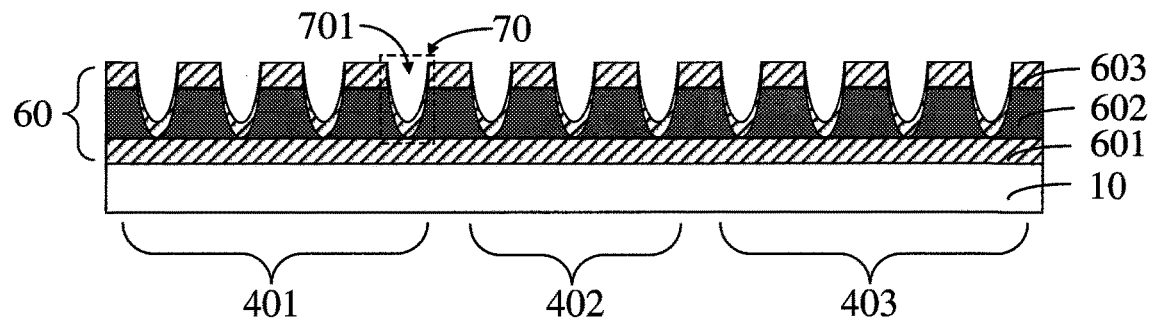

Refer to FIG. 12D. The third metal layer 603 may be titanium.

In an embodiment, the thickness of the first metal layer 601 may be the same as the thickness of the third metal layer, and the thickness of the second metal layer 602 is greater than the thickness of the first metal layer 601 or the thickness of the third metal layer 603.

Refer to FIG. 13A to FIG. 13E, which are diagrams showing the first manufacturing process of the bending region of the flexible display panel of the present disclosure.

Step S30 may further include the following steps of:

S3021: forming the first metal layer 601, the second metal layer 602, and the third metal layer 603 on the organic filling layer.

Figure 13A:
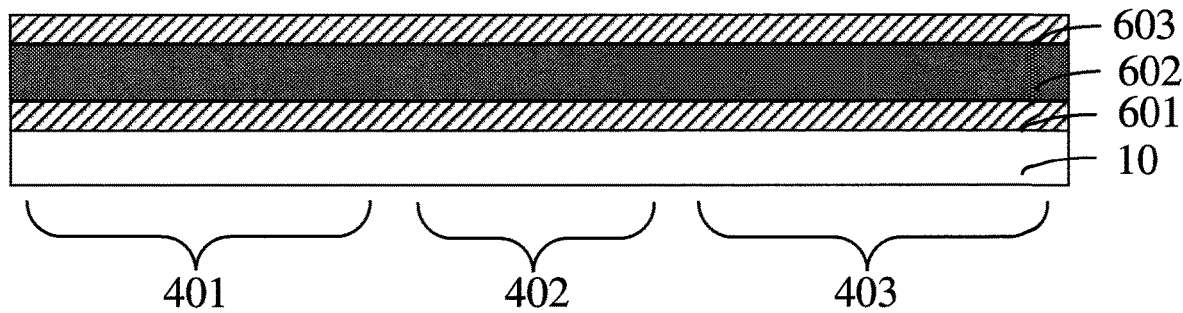
FIG. 13A to FIG. 13E are diagrams showing the first manufacturing process of the bending region of the flexible display panel of the present disclosure.

Refer to FIG. 13A. The first metal layer 601 may be titanium, the second metal layer 602 may be aluminum, and the third metal layer 603 may be titanium.

S3022: the third metal layer 603 corresponding to the stress buffer region 70, the second metal layer 602 and the third metal layer 603 corresponding to the stress buffer region 70, or the first metal layer 601, the second metal layer 602, and the third metal layer 603 corresponding to the stress buffer region 70 are etched to form the stress relieving feature 701 in the stress buffer region 70.

Figure 13B:
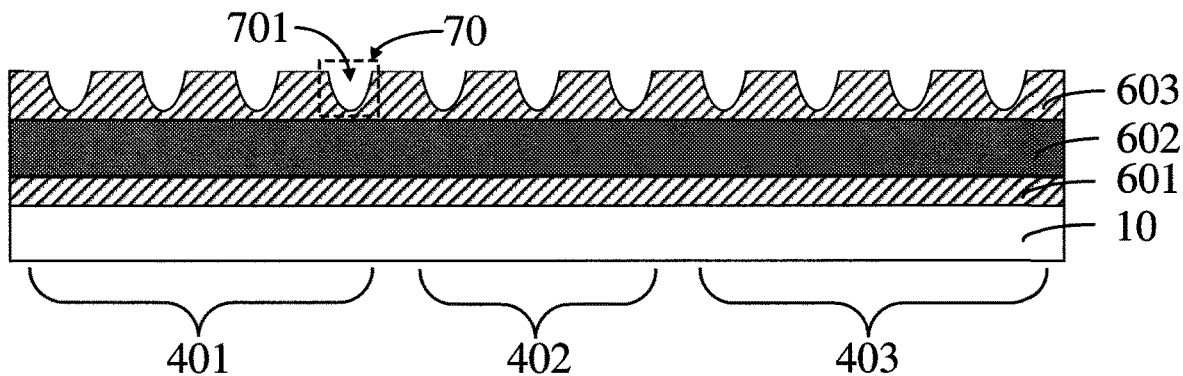

Refer to FIG. 13B. The third metal layer 603 corresponding to the stress buffer region 70 is etched, and the etching depth does not exceed the thickness of the third metal layer 603.

Figure 13C:
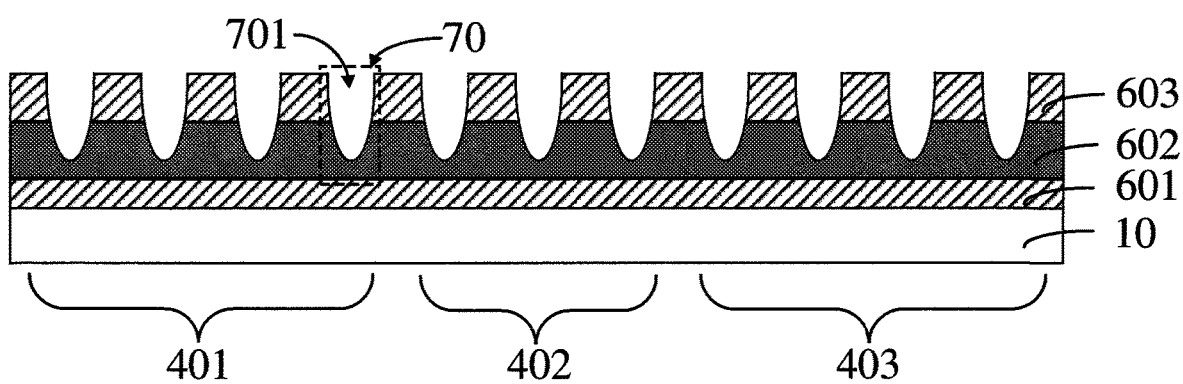

Refer to FIG. 13C. The second metal layer 602 and the third metal layer 603 corresponding to the stress buffer region 70 are etched, and the etching depth does not exceed the thickness of the third metal layer 603 in combination with the second metal layer 602.

Figure 13D:
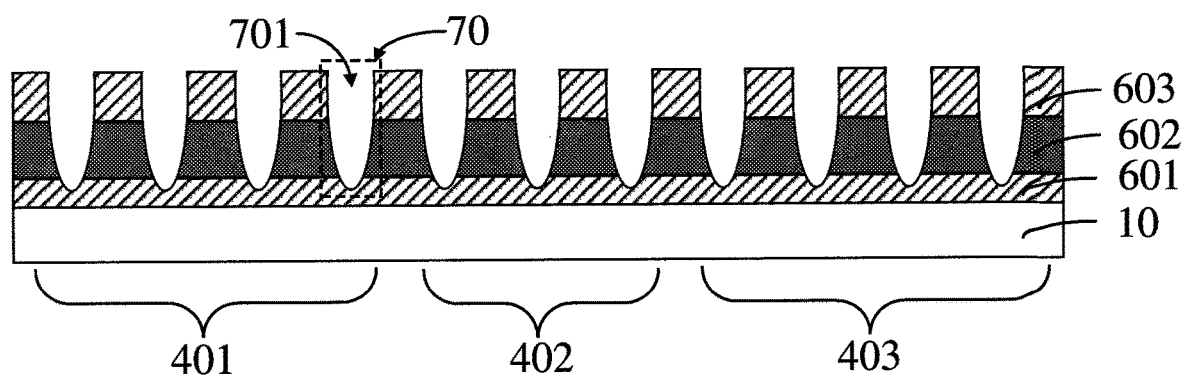

Refer to FIG. 13D. The first metal layer 601, the second metal layer 602, and the third metal layer 603 corresponding to the stress buffer region 70 are etched, and the etching depth does not exceed the thickness of the third metal layer 603 in combination with the second metal layer 602 and the first metal layer 601.

In an embodiment, the etching process may be one of dry etching and wet etching.

S3023: forming a fourth metal layer on the third metal layer 603.

Figure 13E:
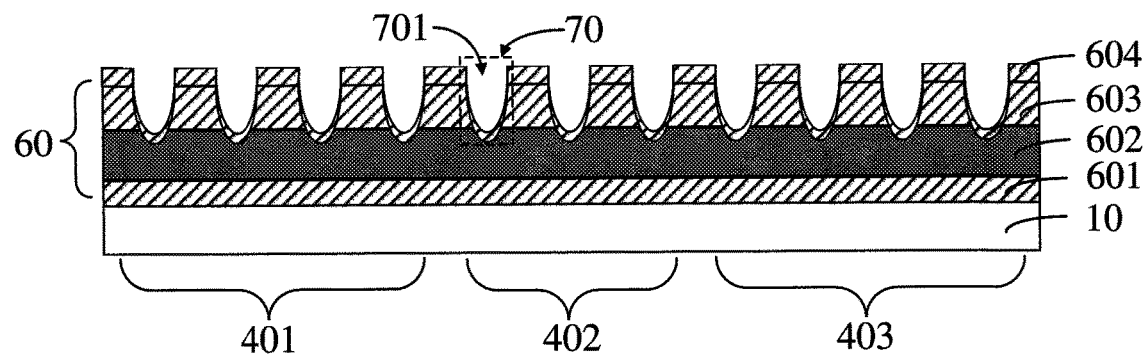

Refer to FIG. 13E. The fourth metal layer may be titanium metal.

In an embodiment, the thickness of the first metal layer 601 and the thickness of the third metal layer 603 may be the same as the thickness of the fourth metal layer, and the thickness of the second metal layer 602 is greater than the thickness of the first metal layer, the thickness of the fourth metal layer 603, or the thickness of the fourth metal layer.

The bending region 40 includes a first bending segment 401, a second bending segment 402, and a third bending segment 403. The first bending segment 401 is adjacent to the display region 200, the third bending segment 403 is away from the display region 200, and the second bending segment 402 is located between the first bending segment 401 and the third bending segment 403.

In an embodiment, the distribution density of the grooves varies over the first bending segment 401, the second bending segment 402, and the third bending segment 403.

In an embodiment, a radius of curvature of the second bending segment 402 is not greater than a radius of curvature of the first bending segment 401, and the radius of curvature of the second bending segment 402 is not greater than a radius of curvature of the third bending segment 403.

Refer to FIG. 5. The distribution density of the grooves within the second bending segment 402 is not less than the distribution density of the grooves within the first bending segment 401, and the distribution density of the grooves within the second bending segment 402 is not less than the distribution density of the grooves within the third bending segment 403.

In an embodiment, the thickness of the metal layer of the second bending segment 402 is not greater than the thickness of the metal layer of the first bending segment 401, and the thickness of the metal layer of the second bending segment 402 is not greater than the thickness of the metal layer of the third bending segment 403.

Refer to FIG. 6. The thickness of the metal layer of the data signal lines 60 gradually decreases along the direction from the first binding segment 401 to the second binding segment 402. The thickness of the metal layer of the data signal lines 60 gradually increases along the direction from the second binding segment 402 to the third binding segment 403.

Refer to FIG. 7. The depth of the grooves gradually increases along the direction from the first bending segment 401 to the second bending segment 402, and the depth of the grooves gradually decreases along the direction from the second bending segment 402 to the third bending segment 403.

In an embodiment, the radius of curvature of the second bending segment 402 is greater than the radius of curvature of the first bending segment 401, and the radius of curvature of the second bending segment 402 is greater than the radius of curvature of the third bending segment 403.

Refer to FIG. 8. The distribution density of the grooves within the second bending segment 402 is less than the distribution density of the grooves within the first bending segment 401, and the distribution density of the grooves within the second bending segment 402 is less than the distribution density of the grooves within the third bending segment 403.

The thickness of the metal layer of the second bending segment 402 is greater than the thickness of the metal layer of the first bending segment 401, and the thickness of the metal layer of the second bending segment 402 is greater than the thickness of the metal layer of the third bending segment 403.

Refer to FIG. 9. The thickness of the metal layer of the data signal lines gradually increases along the direction from the first bending segment 401 to the second bending segment 402 and the thickness of the metal layer of the data signal lines gradually decreases along the direction from the second bending segment 402 to the third bending segment 403.

Refer to FIG. 10. The depth of the grooves gradually decreases along the direction from the first bending segment 401 to the second bending segment 402, and the depth of the grooves gradually increases along the direction from the second bending segment 402 to the third bending segment 403.

In accordance with another aspect of the present disclosure, a display module is further provided. The display module includes the flexible display panel 100, and further includes a touch layer, a polarizing layer, and a cover layer disposed on the flexible display panel 100.

In accordance with still another aspect of the present disclosure, an electronic apparatus is further provided. The electronic apparatus includes the display module. The electronic apparatus includes, but is not limited to, mobile phones, tablet computers, computer displays, game machines, televisions, display screens, wearable devices, and other living appliances or household appliances with display functions.

A working principle of the display module and a working principle of the electronic apparatus are similar to a working principle of the flexible display panel. For the working principle of the display module and the working principle of the electronic apparatus, refer to the aforementioned content of the flexible display. The working principle of the display panel is not described here again.

A flexible display panel and a method for manufacturing same are provided in the present disclosure. The flexible display panel includes a bending region, and data signal lines are disposed within the bending region. At least one of the data signal lines includes at least one metal layer, at least one of the data signal lines includes at least one stress buffer region, and a stress relieving feature is disposed within the stress buffer region. In the present disclosure, by disposing the stress relieving feature on the data signal lines in the bending region, not only is the bending stress of the data signal lines reduced upon being bent, but also the impedance of the data signal lines is decreased, thereby effectively improving the technical problem of the broken signal lines after being bent and the failed signal transmission, and prolonging the service life of the flexible display panel.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A flexible display panel, comprising:
a display region, and
a non-display region located at a periphery of the display region,
wherein the non-display region includes a bending region, data signal lines are disposed within the bending region, at least one of the data signal lines includes at least one metal layer, and the data signal lines include at least a first metal layer, a second metal layer and a third metal layer;
wherein at least one of the data signal lines includes at least one stress buffer region, a stress relieving feature is disposed within the stress buffer region, the stress relieving feature is grooves, and the stress buffer region includes at least the first metal layer and the third metal layer;
wherein in a condition that the stress buffer region only includes the first metal layer, and the third metal layer, a maximum depth of the grooves is not less than a sum of a thickness of the second metal layer and a thickness of the third metal layer.

2. The flexible display panel as claimed in claim 1, wherein the bending region includes a first bending segment, a second bending segment, and a third bending segment, the first bending segment is adjacent to the display region, the third bending segment is away from the display region, the second bending segment is located between the first bending segment and the third bending segment; and
a distribution density of the grooves varies over the first bending segment, the second bending segment, and the third bending segment.

3. The flexible display panel as claimed in claim 2, wherein a radius of curvature of the second bending segment is not greater than a radius of curvature of the first bending segment, and the radius of curvature of the second bending segment is not greater than a radius of curvature of the third bending segment.

4. The flexible display panel as claimed in claim 3, wherein the distribution density of the grooves within the second bending segment is not less than the distribution density of the grooves within the first bending segment, and the distribution density of the grooves within the second bending segment is not less than the distribution density of the grooves within the third bending segment.

5. The flexible display panel as claimed in claim 3, wherein a thickness of the metal layer of the second bending segment is not greater than a thickness of the metal layer of the first bending segment, and the thickness of the metal layer of the second bending segment is not greater than a thickness of the metal layer of the third bending segment.

6. The flexible display panel as claimed in claim 5, wherein a thickness of the metal layer of the data signal lines gradually decreases along a direction from the first bending segment to the second bending segment; and
the thickness of the metal layer of the data signal lines gradually increases along a direction from the second bending segment to the third bending segment.

7. The flexible display panel as claimed in claim 3, wherein a depth of the grooves gradually increases along a direction from the first bending segment to the second bending segment; and
the depth of the grooves gradually decreases along a direction from the second bending segment to the third bending segment.

8. The flexible display panel as claimed in claim 2, wherein a radius of curvature of the second bending segment is greater than a radius of curvature of the first bending segment, and a radius of curvature of the second bending segment is greater than a radius of curvature of the third bending segment.

9. The flexible display panel as claimed in claim 8, wherein the distribution density of the grooves within the second bending segment is less than the distribution density of the grooves within the first bending segment, and the distribution density of the grooves within the second bending segment is less than the distribution density of the grooves within the third bending segment.

10. The flexible display panel as claimed in claim 8, wherein a thickness of the metal layer of the second bending segment is greater than a thickness of the metal layer of the first bending segment, and the thickness of the metal layer of the second bending segment is greater than a thickness of the metal layer of the third bending segment.

11. The flexible display panel as claimed in claim 10, wherein a thickness of the metal layer of the data signal lines gradually increases along a direction from the first bending segment to the second bending segment; and the thickness of the metal layer of the data signal lines gradually decreases along a direction from the second bending segment to the third bending segment.

12. The flexible display panel as claimed in claim 8, wherein a depth of the grooves gradually decreases along a direction from the first bending segment to the second bending segment; and the depth of the grooves gradually increases along a direction from the second bending segment to the third bending segment.

13. A method for manufacturing a flexible display panel including a display region and a non-display region located at a periphery of the display region, the non-display region including a bending region, wherein the method for manufacturing the flexible display panel comprises following steps of:

providing a substrate;

forming a thin film transistor layer and an organic filling layer on the substrate; and forming at least one data signal line on the thin film transistor layer and the organic filling layer, wherein the at least one data signal line includes at least one metal layer, the at least one data signal line includes at least one stress buffer region, and a stress relieving feature is disposed within the stress buffer region;

wherein the step of forming the at least one data signal line on the organic filling layer comprises following steps of:

forming a first metal layer and a second metal layer sequentially on the organic filling layer;

performing an etching process on the second metal layer corresponding to the stress buffer region, or on both the first metal layer and the second metal layer corresponding to the stress buffer region, to form the stress relieving feature in the stress buffer region; and forming a third metal layer on the second metal layer.

\* \* \* \* \*